US012628529B2

(12) United States Patent
Lee et al.

(10) Patent No.: US 12,628,529 B2
(45) Date of Patent: May 12, 2026

(54) WINDOW, DISPLAY DEVICE INCLUDING THE SAME AND METHOD FOR MANUFACTURING THE WINDOW

(71) Applicant: Samsung Display Co., Ltd., Yongin-si (KR)

(72) Inventors: Jaeho Lee, Yongin-si (KR); Jun Hak Oh, Yongin-si (KR); Jeong Seok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 403 days.

(21) Appl. No.: 18/491,334

(22) Filed: Oct. 20, 2023

(65) Prior Publication Data

US 2024/0237482 A1    Jul. 11, 2024

(30) Foreign Application Priority Data

Jan. 5, 2023    (KR) ........................ 10-2023-0001607

(51) Int. Cl.
H10K 59/80 (2023.01)
C03B 32/02 (2006.01)
(Continued)

(52) U.S. Cl.
CPC ........... H10K 59/871 (2023.02); C03B 32/02 (2013.01); C03C 10/00 (2013.01);
(Continued)

(58) Field of Classification Search
CPC .... H10K 59/871; H10K 59/872; H10K 59/12; H10K 59/87; H10K 59/8791; C03B 32/02; C03C 10/00; C03C 10/0027; C03C 15/00; C03C 21/002; C03C 2204/00; C03C 3/083; C03C 3/097; H05K 5/03; G06F 1/1637;
(Continued)

(56) References Cited

U.S. PATENT DOCUMENTS 6,934,080 B2    8/2005 Saccomanno et al.
7,150,767 B1    12/2006 Schneider et al.
(Continued)

FOREIGN PATENT DOCUMENTS

KR    10-1991-0017549    11/1991
KR    10-1992-0004292    3/1992
(Continued)

OTHER PUBLICATIONS

Schulz et al., "Antireflective coating with nanostructured organic top-layer", 2010, Optical Society of America, 3 pages.

*Primary Examiner* — Karen Kusumakar
(74) *Attorney, Agent, or Firm* — F. CHAU & ASSOCIATES, LLC

(57) ABSTRACT
A window includes a glass substrate having a plurality of first portions and a plurality of second portions. The plurality of first and second portions are alternately arranged with each other along a first direction. An upper surface of each of the plurality of first portions includes a first depressed pattern of a plurality of first depressed patterns defined therein. A first length in the first direction of each of the plurality of first depressed patterns is in a range of about 20 nm to about 2000 nm. A crystal content of each of the plurality of second portions is greater than a crystal content of each of the plurality of first portions.

20 Claims, 9 Drawing Sheets

(51) Int. Cl.
     *C03C 10/00*        (2006.01)
     *C03C 15/00*        (2006.01)
     *C03C 21/00*        (2006.01)
     *H05K 5/03*         (2006.01)

(52) U.S. Cl.
     CPC .......... *C03C 10/0027* (2013.01); *C03C 15/00*
          (2013.01); *C03C 21/002* (2013.01); *H05K*
          *5/03* (2013.01); *C03C 2204/00* (2013.01)

(58) Field of Classification Search
     CPC .......... G06F 1/1601; G09F 9/301; G09F 9/33;
          G09F 9/335; H10H 20/8506; H10H
                                  29/142
     See application file for complete search history.

(56)          References Cited

U.S. PATENT DOCUMENTS

| | | |
|---|---|---|
| 9,469,056 B2 | 10/2016 | Isurugi et al. |
| 10,133,000 B2 | 11/2018 | Sanghera et al. |
| 10,802,356 B2 | 10/2020 | Harrold et al. |
| 10,901,219 B2 | 1/2021 | Tekolste et al. |
| 10,911,017 B2 | 2/2021 | Plesski |
| 10,935,714 B2 | 3/2021 | Woodgate et al. |
| 10,962,855 B2 | 3/2021 | Schowengerdt et al. |
| 10,976,578 B2 | 4/2021 | Robinson et al. |
| 11,016,300 B2 | 5/2021 | Tekolste et al. |
| 11,016,318 B2 | 5/2021 | Robinson et al. |
| 11,036,109 B2 | 6/2021 | Oh |
| 11,042,032 B2 | 6/2021 | Tekolste et al. |
| 11,067,797 B2 | 7/2021 | Schowengerdt et al. |
| 11,070,791 B2 | 7/2021 | Woodgate et al. |
| 11,092,851 B2 | 8/2021 | Robinson et al. |
| 11,115,647 B2 | 9/2021 | Woodgate et al. |
| 11,179,747 B2 | 11/2021 | Lipkens et al. |
| 2004/0105159 A1 | 6/2004 | Saccomanno et al. |
| 2010/0075180 A1* | 3/2010 | Ueda .................. G11B 5/73923 |
| | | 427/128 |
| 2011/0278770 A1 | 11/2011 | Isurugi et al. |
| 2012/0305521 A1 | 12/2012 | Hubbard et al. |
| 2013/0083402 A1 | 4/2013 | Sanghera et al. |
| 2014/0197559 A1 | 7/2014 | Isurugi et al. |
| 2015/0362707 A1 | 12/2015 | Sanghera et al. |
| 2018/0201540 A1* | 7/2018 | Sheen ................... C03C 17/245 |
| 2019/0293983 A1 | 9/2019 | Robinson et al. |
| 2019/0322573 A1 | 10/2019 | Kang et al. |
| 2022/0196224 A1 | 6/2022 | Kozodoy et al. |
| 2022/0344443 A1 | 10/2022 | Yamazaki et al. |

FOREIGN PATENT DOCUMENTS

| | | |
|---|---|---|
| KR | 10-1994-0008175 | 4/1994 |
| KR | 10-0192652 | 1/1999 |
| KR | 10-0357955 | 10/2002 |
| KR | 10-2004-0095315 | 11/2004 |
| KR | 10-0491015 | 5/2005 |
| KR | 10-0517096 | 9/2005 |
| KR | 10-0784338 | 12/2007 |
| KR | 10-2008-0002687 | 1/2008 |
| KR | 10-0796755 | 1/2008 |
| KR | 10-2008-0029177 | 4/2008 |
| KR | 10-2010-0049992 | 5/2010 |
| KR | 10-2011-0115792 | 10/2011 |
| KR | 10-1220219 | 1/2013 |
| KR | 10-1288822 | 7/2013 |
| KR | 10-1387058 | 4/2014 |
| KR | 10-2017-0011979 | 2/2017 |
| KR | 10-2017-0081327 | 7/2017 |
| KR | 10-1996662 | 7/2019 |
| KR | 10-2180262 | 11/2020 |
| KR | 10-2218086 | 2/2021 |
| KR | 10-2324350 | 11/2021 |
| KR | 10-2349047 | 1/2022 |
| KR | 10-2022-0066070 | 5/2022 |
| KR | 10-2486989 | 1/2023 |

* cited by examiner

WINDOW, DISPLAY DEVICE INCLUDING THE SAME AND METHOD FOR MANUFACTURING THE WINDOW

CROSS-REFERENCE TO RELATED APPLICATIONS

This application claims priority under 35 U.S.C. § 119 to Korean Patent Application No. 10-2023-0001607, filed on Jan. 5, 2023 in the Korean Intellectual Property Office, the disclosure of which is incorporated by reference in its entirety herein.

1. TECHNICAL FIELD

Embodiments of the present disclosure described herein relate to a window, a display device including the window, and a method for manufacturing the window, and more particularly, relate to a window including a glass substrate including a first portion and a second portion having different crystal contents, a display device including the same, and a method for manufacturing the window.

2. DISCUSSION OF RELATED ART

A display device is activated according to an electrical signal to display an image to a user. The display device may include a window, a housing, and an electronic element. The electronic element may include various elements activated according to an electrical signal, such as a display element, a touch element and/or a detection element.

The window may be disposed on a front surface of the display device to protect the electronic element and to provide an active area to a user. The electronic element may be stably protected from external impact by the window. Accordingly, a method of reinforcing a window to exhibit increased strength and display quality is being studied.

SUMMARY

Embodiments of the present disclosure provide a window having increased durability and reduced reflectivity of external light.

Further, embodiments of the present disclosure provide a display device including a window having reduced reflectivity of external light and thus having improved display quality.

In an embodiment, a window includes a glass substrate having a plurality of first portions and a plurality of second portions. The plurality of first and second portions are alternately arranged with each other along a first direction. An upper surface of each of the plurality of first portions includes a first depressed pattern of a plurality of first depressed patterns defined therein. A first length in the first direction of each of the plurality of first depressed patterns is in a range of about 20 nm to about 2000 nm. A crystal content of each of the plurality of second portions is greater than a crystal content of each of the plurality of first portions.

In an embodiment, a crystal content of the glass substrate may be in a range of about 20% to about 80%.

In an embodiment, a ratio of a spacing in the first direction between adjacent ones of the plurality of first portions to the first length may be in a range of about 0.7 to about 1.3.

In an embodiment, a lower surface of each of the plurality of first portions that is opposite to the upper surface of each of the plurality of first portions includes a second depressed pattern of a plurality of second depressed patterns defined therein. A second length in the first direction of each of the plurality of second depressed patterns may be in a range of about 20 nm to about 2000 nm.

In an embodiment, an outer surface of the glass substrate may be defined as an outermost surface of the window.

In an embodiment, the glass substrate may include one compound selected from $LiAl(SiO)_2$, $LiAlSi_4O_{10}$, and $Li_2Si_2O_5$.

In an embodiment, a Si atomic ratio relative to a total composition of each of the plurality of first portions may be different from a Si atomic ratio relative to a total composition of each of the plurality of second portions.

In an embodiment, each of the plurality of second portions may include one compound selected from $P_2O_5$, $TiO_2$, and $ZrO_2$.

In an embodiment, a display device includes a display module. A window is disposed on the display module. The window includes a glass substrate. The glass substrate may include a plurality of first portions and a plurality of second portions. The plurality of first and second portions are alternately arranged with each other along a first direction. An upper surface of each of the plurality of first portions includes a first depressed pattern of a plurality of first depressed patterns defined therein. A first length in the first direction of each of the plurality of first depressed patterns may be in a range of about 20 nm to about 2000 nm. A crystal content of each of the plurality of second portions may be greater than a crystal content of each of the plurality of first portions.

In an embodiment, at least a portion of natural light incident on the first portion or the second portion may be Mie-scattered at the first portion or the second portion.

In an embodiment, the glass substrate may not include $MgF_2$ or MgO.

In an embodiment, a method for manufacturing a window may include providing a pre-glass substrate including a plurality of first pre-portions and a plurality of second pre-portions. The plurality of first and second pre-portions are alternately arranged with each other along a first direction. A first depressed pattern of a plurality of first depressed patterns is formed in an upper surface of each of the plurality of first pre-portions, thereby forming a glass substrate. A crystal content of each of the plurality of first pre-portions may be lower than a crystal content of each of the plurality of second pre-portions. A first length in the first direction of each of the plurality of first depressed patterns may be in a range of about 20 nm to about 2000 nm.

In an embodiment, the providing of the pre-glass substrate may include providing a glass composition. The glass composition may include a base material and a nucleating agent. The base material may include one compound selected from $LiAl(SiO)_2$, $LiAlSi_4O_{10}$, and $Li_2Si_2O_5$. The nucleating agent may include one compound selected from $P_2O_5$, $TiO_2$, and $ZrO_2$.

In an embodiment, a weight percentage of the nucleating agent relative to a total weight of the glass composition may be in a range of about 1 wt % to about 10 wt %.

In an embodiment, the providing of the pre-glass substrate may further include partially crystallizing the glass composition after the providing of the glass composition is performed.

In an embodiment, the partially crystallizing of the glass composition may include a nucleation step and a crystal growth step. The nucleation step may be performed at a temperature in a range of about 500° C. to about 700° C. The crystal growth step may be performed at a temperature in a range of about 600° C. to about 900° C.

In an embodiment, the forming of the glass substrate may include performing a wet etching process on a surface of the pre-glass substrate. The wet etching process may include applying etchant on the pre-glass substrate.

In an embodiment, the etchant may include at least one compound selected from nitric acid, ammonium fluoride, phosphoric acid, and hydrochloric acid.

In an embodiment, an etch rate at which the first pre-portion is etched by the etchant may be greater than an etch rate at which the second pre-portion is etched by the etchant.

In an embodiment, the forming of the glass substrate may include chemical strengthening of the pre-glass substrate. The chemical strengthening of the pre-glass substrate may be performed after the wet etching process is performed or may be performed after the providing of the pre-glass substrate is performed and before the wet etching process is performed.

BRIEF DESCRIPTION OF THE FIGURES

The above and other objects and features of the present disclosure will become apparent by describing in detail embodiments thereof with reference to the accompanying drawings.

DETAILED DESCRIPTION OF EMBODIMENTS

Figure 1:
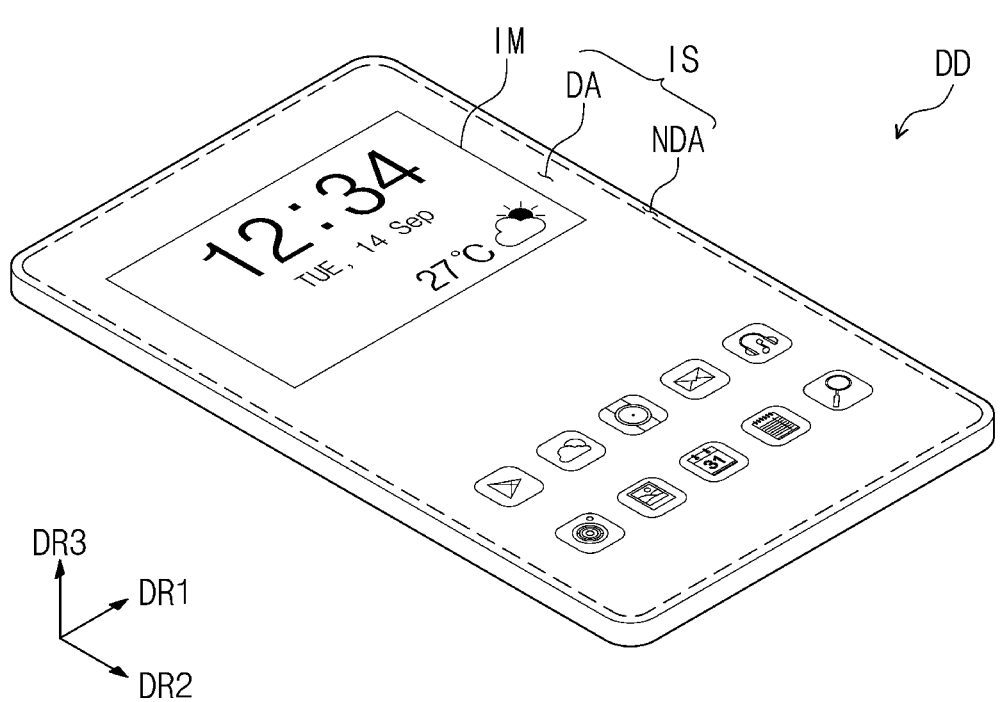
FIG. 1 is a perspective view showing a display device according to an embodiment of the present disclosure.

The present disclosure may have various changes and various forms. Thus, non-limiting embodiments will be illustrated in the drawings and described in detail herein. However, it should be understood that the described embodiments are not intended to limit the present disclosure to the specific disclosed form. The present disclosure includes all modifications, equivalents, and substitutes included in the spirit and scope of the present disclosure.

As used herein, when a component (or a region, a layer, a portion, and the like) is referred to as being "on", "connected to", or "coupled to" another component, it means that the component may be directly disposed/connected/coupled on another component or a third component may be disposed between the component and another component. When a component (or a region, a layer, a portion, and the like) is referred to as being "directly on", "directly connected to", or "directly coupled to" another component, no intervening components may be present.

Like reference numerals refer to like components. In addition, in the drawings, thicknesses, ratios, and dimensions of components may be exaggerated for effective description of technical content. "and/or" includes all of one or more combinations that the associated components may define.

Terms such as first, second, and the like may be used to describe various components, but the components should not necessarily be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

As used herein, "being directly disposed" may mean that there is no layer, film, region, plate, etc. between a first layer, film, region, plate, etc., and a second layer, film, region, plate, etc. For example, "being directly disposed" may mean that an additional member such as an adhesive member is absent between two layers or two members.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a window of an embodiment and a display device including the same will be described with reference to the drawings.

FIG. 1 is a perspective view showing a display device of an embodiment.

A display device DD of an embodiment as shown in FIG. 1 may be a device that is activated according to an electrical signal. The display device DD may be a flexible device. For example, in an embodiment the display device DD may be a portable electronic device, a tablet, a car navigation system, a game console, a personal computer, a notebook computer, or a wearable device. However, embodiments of the present disclosure are not necessarily limited thereto. FIG. 1 shows that the display device DD is a portable electronic device by way of example.

The display device DD may display an image IM through a display surface IS. The display surface IS may include a display area DA and a non-display area NDA adjacent to the display area DA. The non-display area NDA may be an area in which an image is not displayed. However, embodiments of the present disclosure are not necessarily limited thereto. For example, in some embodiments the non-display area NDA may be omitted. In an embodiment, the display surface IS may be arranged in a plane defined by first and second directions DR1 and DR2.

As used herein, the first direction DR1 and the second direction DR2 may be orthogonal to each other, and a third direction DR3 may be normal to a plane defined by the first and second directions DR1 and DR2. However, embodiments of the present disclosure are not necessarily limited thereto and the first and second directions DR1, DR2 may cross each other at various different angles. A thickness direction of the display device DD may be parallel to the third direction DR3. As used herein, an upper surface (e.g., a front surface) and a lower surface (e.g., a rear surface) of each of members constituting the display device DD may be defined based on the third direction DR3. Further, directions indicated by the first to third directions DR1, DR2, and DR3 as described herein may be a relative concept and may be exchanged with each other.

Figure 2:
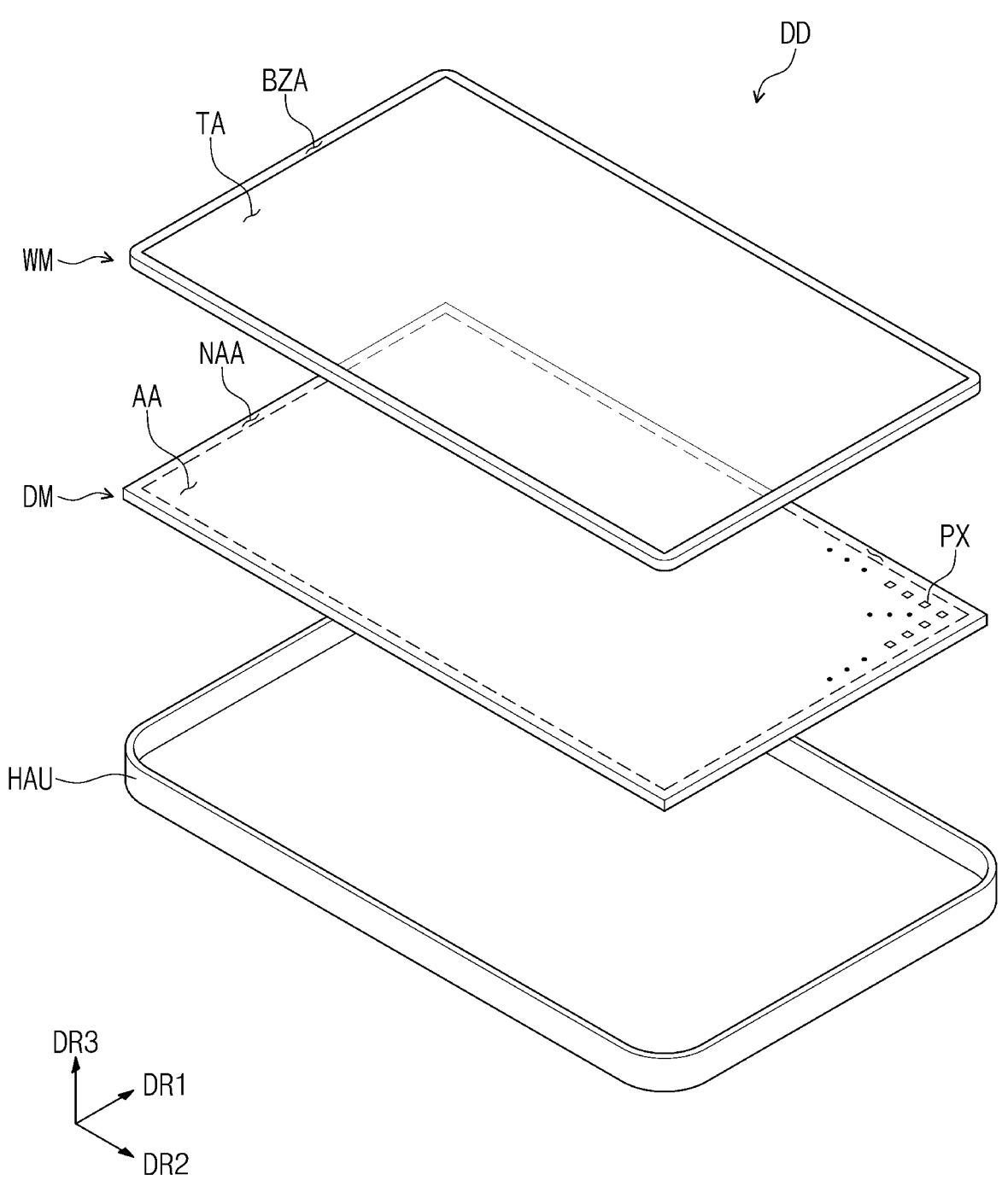
FIG. 2 is an exploded perspective view of a display device according to an embodiment of the present disclosure.

FIG. 2 is an exploded perspective view of a display device according to an embodiment.

Referring to FIG. 2, the display device DD may include a display module DM and a window WM disposed on top of the display module DM (e.g., in the third direction DR3). Further, in an embodiment the display device DD may further include a housing HAU in which the display module DM is accommodated.

Referring to FIG. 1 and FIG. 2, the display module DM is activated to display the image IM on the display surface IS of the display device DD. The display module DM may be activated according to an electrical signal. Further, the display module DM may be activated to detect an external input applied to a top surface thereof. In an embodiment, the external input may include a touch, contact or proximity of a user or an inanimate object, pressure, light, heat, etc. However, embodiments of the present disclosure are not necessarily limited thereto.

The display module DM may include an active area AA and a peripheral area NAA. The active area AA may be an area providing the image IM. A pixel PX may be disposed in the active area AA. The peripheral area NAA may be adjacent to the active area AA. The peripheral area NAA may surround the active area AA. For example, in an embodiment, the peripheral area NAA may fully surround the active area AA (e.g., in the first and second directions DR1, DR2). However, embodiments of the present disclosure are not necessarily limited thereto. A driver circuit or a driving wiring for driving the active area AA may be disposed in the peripheral area NAA.

The display module DM may include a plurality of pixels PX. Each of the pixels PX may emit light in response to an electrical signal. The light emitted from the pixels PX may collectively display the image IM. Each of the pixels PX may include a display element. For example, in an embodiment the display element may be an organic light-emitting element, a quantum dot light-emitting element, an electrophoretic element, an electrowetting element, and the like.

The window WM may have a high light transmittance to be used as a cover window for the display module DM. For example, in an embodiment the window WM may have a high light transmittance in a range of about 90% or higher of light in a wavelength in a range of about 400 nm to about 700 nm emitted from the display module DM.

The window WM may include a transmissive area TA and a bezel area BZA. The transmissive area TA may overlap at least a portion of the active area AA of the display module DM. The transmissive area TA may be an optically transparent area. The image IM may be provided to the user through the transmissive area TA, and the user may receive information through the image IM.

The bezel area BZA may be an area having a relatively low light transmittance compared to that of the transmissive area TA. The bezel area BZA may define a shape of the transmissive area TA. For example, the bezel area BZA may be adjacent to and surround the transmissive area TA (e.g., in the first and/or second directions DR1, DR2).

The bezel area BZA may have a predetermined color. The bezel area BZA may cover the peripheral area NAA of the display module DM so as to prevent the peripheral area NAA from being viewed from an outside. However, embodiments of the present disclosure are not necessarily limited thereto. For example, in some embodiments the bezel area BZA may be omitted.

In the display device DD, the window WM and the housing HAU may be combined with each other to constitute an external appearance of the display device DD. The housing HAU may be disposed under the display module DM (e.g., in the third direction DR3). The housing HAU may include a material with relatively high rigidity. For example, in an embodiment the housing HAU may include a plurality of frames and/or plates made of glass, plastic, or metal. The housing HAU may provide a predetermined accommodation space. The display module DM may be accommodated in the accommodation space and may be protected from external impact.

Figure 3:
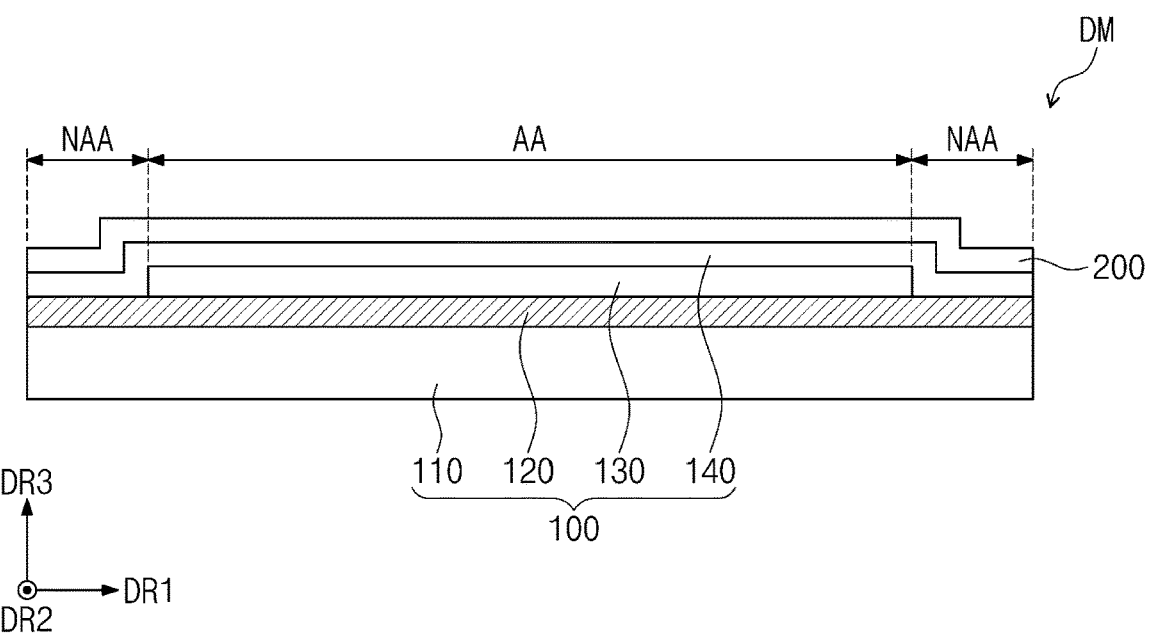
FIG. 3 is a cross-sectional view showing a display module according to an embodiment of the present disclosure.

FIG. 3 is a cross-sectional view of the display module DM of an embodiment.

Referring to FIG. 3, the display module DM according to an embodiment may include a display panel 100 and a sensor layer 200.

The display panel 100 may be a component that generates an image. The display panel 100 may be a light-emitting display panel. For example, in an embodiment the display panel 100 may be an organic light-emitting display panel, an inorganic light-emitting display panel, a micro LED display panel, or a nano LED display panel. The display panel 100 may be referred to as a display layer.

In an embodiment, the display panel 100 may include a base substrate 110, a circuit layer 120, a light-emitting element layer 130, and an encapsulation layer 140.

The base substrate 110 may be a member providing a base surface on which the circuit layer 120 is disposed. The base substrate 110 may be a rigid substrate or a flexible substrate capable of being bent, folded, or rolled. For example, the base substrate 110 may be a glass substrate, a metal substrate, or a polymer substrate. However, embodiments of the present disclosure are not necessarily limited thereto, and the base substrate 110 may be an inorganic layer, an organic layer, or a composite material layer. The base substrate 110 may have a multilayer structure. For example, the base substrate 110 may include a first synthetic resin layer, an inorganic layer of a multi-layer or single-layer structure, and a second synthetic resin layer disposed on the inorganic layer of the multi-layer or single-layer structure. Each of the first and second synthetic resin layers may include a polyimide-based resin. However, embodiments of the present disclosure are not necessarily limited thereto.

The circuit layer 120 may be disposed on the base substrate 110 (e.g., disposed directly thereon in the third direction DR3). In an embodiment, the circuit layer 120 may include an insulating layer, a semiconductor pattern, a conductive pattern, and a signal line. In an embodiment, an insulating layer, a semiconductor layer, and a conductive layer may be formed on the base substrate 110 using a scheme such as coating or deposition, and thereafter, the insulating layer, the semiconductor layer, and the conductive layer may be selectively patterned using a plurality of photolithography processes and etching processes. However, embodiments of the present disclosure are not necessarily limited thereto.

The light-emitting element layer 130 may be disposed on the circuit layer 120 (e.g., disposed directly thereon in the third direction DR3). The light-emitting element layer 130 may include a light-emitting element. For example, in an embodiment the light-emitting element may include an organic light-emitting material, an inorganic light-emitting material, an organic-inorganic light-emitting material, a quantum dot, a quantum rod, a micro LED, or a nano LED. However, embodiments of the present disclosure are not necessarily limited thereto.

The encapsulation layer 140 may be disposed on the light-emitting element layer 130 (e.g., disposed directly thereon in the third direction DR3). The encapsulation layer 140 may protect the light-emitting element layer 130 from foreign materials such as moisture, oxygen, and dust particles. The encapsulation layer 140 may include at least one inorganic layer. For example, in an embodiment the encapsulation layer 140 may include a stack structure of an inorganic layer/organic layer/inorganic layer. However, embodiments of the present disclosure are not necessarily limited thereto.

The sensor layer 200 may be disposed on the display panel 100 (e.g., disposed directly thereon in the third direction DR3). The sensor layer 200 may sense an external input applied from the outside. The external input may be a user's input. The user's input may include various types of external inputs such as a part of the user's body, light, heat, pen, or pressure. In an embodiment, the sensor layer 200 may be formed on the display panel 100 via a consecutive process. In this embodiment, the sensor layer 200 may be directly disposed on the display panel 100. In this regard, "being directly disposed" may mean that a third component is not disposed between the sensor layer 200 and the display panel 100. For example, a separate adhesive member may not be disposed between the sensor layer 200 and the display panel 100.

In an embodiment, the display module DM may further include an adhesive layer. The display module DM may be attached to the window WM via an adhesive layer. The adhesive layer may have transparency, and may be, for example, OCA (Optically Clear Adhesive). However, embodiments of the present disclosure are not necessarily limited thereto.

Figure 4:
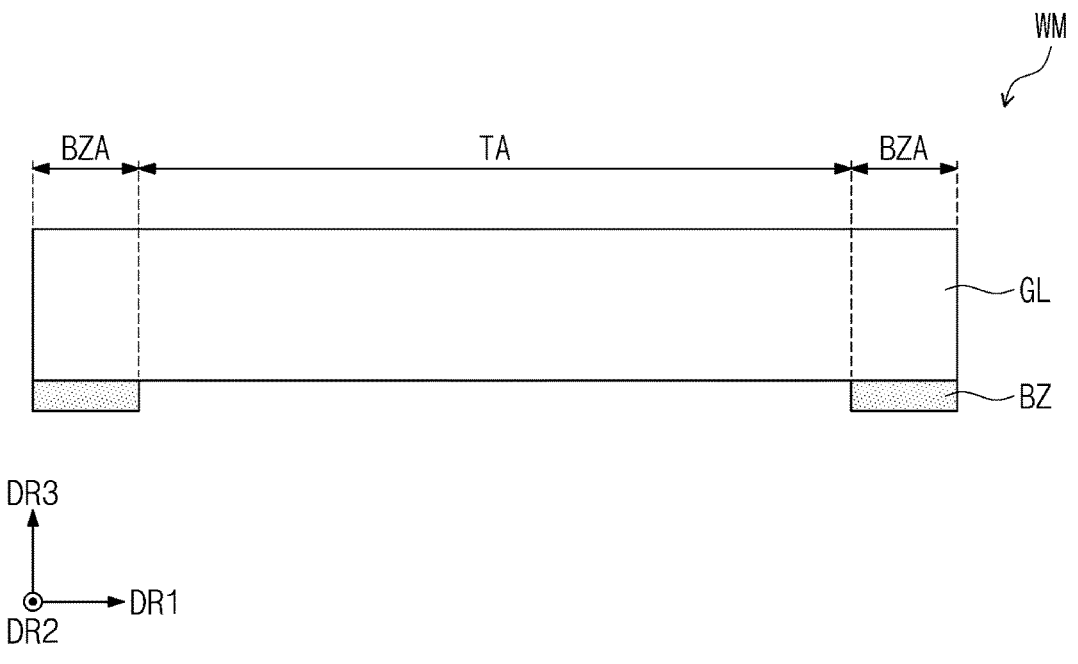
FIG. 4 is a cross-sectional view showing a window according to an embodiment of the present disclosure.

FIG. 4 is a cross-sectional view showing a window according to an embodiment of the present disclosure.

Referring to FIG. 4, the window WM according to an embodiment of the present disclosure may include a glass substrate GL and a bezel pattern BZ disposed under the glass substrate GL (e.g., in the third direction DR3).

The bezel pattern BZ may be disposed under the glass substrate GL so as to define the bezel area BZA. The bezel pattern BZ may have relatively low light transmittance compared to that of the glass substrate GL. For example, in an embodiment the bezel pattern BZ may have a predetermined color. Accordingly, the bezel pattern BZ may selectively transmit/reflect only light of a specific color therethrough/therefrom. Alternatively, in an embodiment the bezel pattern BZ may be a light blocking layer that absorbs incident light thereon. The light transmittance and the color of the bezel pattern BZ may be provided in various ways according to a type and a shape of the display device DD (see FIG. 1).

In an embodiment, the glass substrate GL may include $SiO_2$. The glass substrate GL may further include at least one compound selected from $Al_2O_3$, $Li_2O$, $Na_2O$, $K_2O$, MgO, and CaO in addition to $SiO_2$. The glass substrate GL may further include at least one compound selected from $Fe_2O_3$, ZnO, $ZrO_2$, $TiO_2$, and $P_2O_5$. For example, the glass substrate GL may include one of $LiAl(SiO)_2$, $LiAlSi_4O_{10}$, and $Li_2Si_2O_5$, or may include one of $ZrO_2$, $TiO_2$, and $P_2O_5$. At least a portion of the glass substrate GL may include a crystal portion in which amorphous glass is crystallized. For example, at least a portion of the glass substrate GL may be crystallized glass (e.g., glass-ceramics) including an aggregate of fine crystals inside the glass. Accordingly, the glass substrate GL may have high strength and high fracture toughness.

The glass substrate GL may have a high light transmittance to be used as a cover window in the display device DD (FIG. 1). Accordingly, the glass substrate GL may have high transmittance in a range of about 80% or greater of light in a wavelength in a range of about 400 nm to about 700 nm. For example, the glass substrate GL of an embodiment may have a transmittance of about 90% or greater in the wavelength region of visible light.

A thickness of the glass substrate GL (e.g., length in the third direction DR3) may be in a range of about 20 μm to about 300 μm. For example, the glass substrate GL of an embodiment may have a relatively small thickness in a range of about 20 μm to about 300 μm, and thus may be used as a cover window for the display device DD (FIG. 1) of an embodiment as described above. Thus, the display device DD (FIG. 1) may be relatively slim and lightweight.

The glass substrate GL may be flat. Further, the glass substrate GL may be bent. For example, in an embodiment the glass substrate GL may be bent convexly or concavely around a central portion. However, embodiments of the present disclosure are not necessarily limited thereto, and the glass substrate GL may be provided in various shapes.

A separate member may not be disposed on the glass substrate GL. One layer including $MgF_2$ or MgO may not be disposed on the glass substrate GL. For example, an outer surface of the glass substrate GL may be defined as the outermost surface of the window WM. The upper surface of the glass substrate GL may be directly exposed to external light O_LR (see FIG. 6) incident from the outside (e.g., natural light).

Figure 5A:
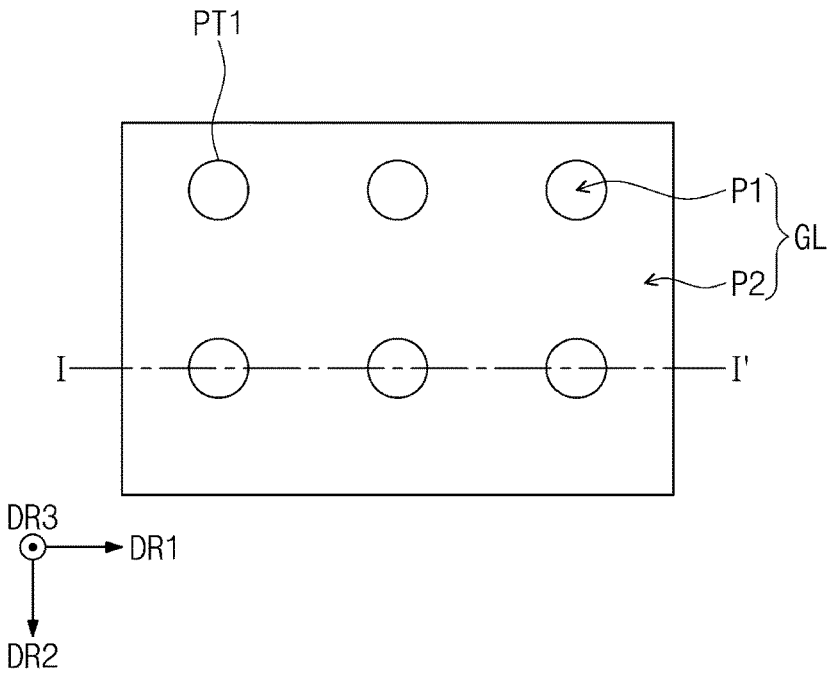
FIG. 5A is a plan view showing a glass substrate according to an embodiment of the present disclosure.
Figure 5B:
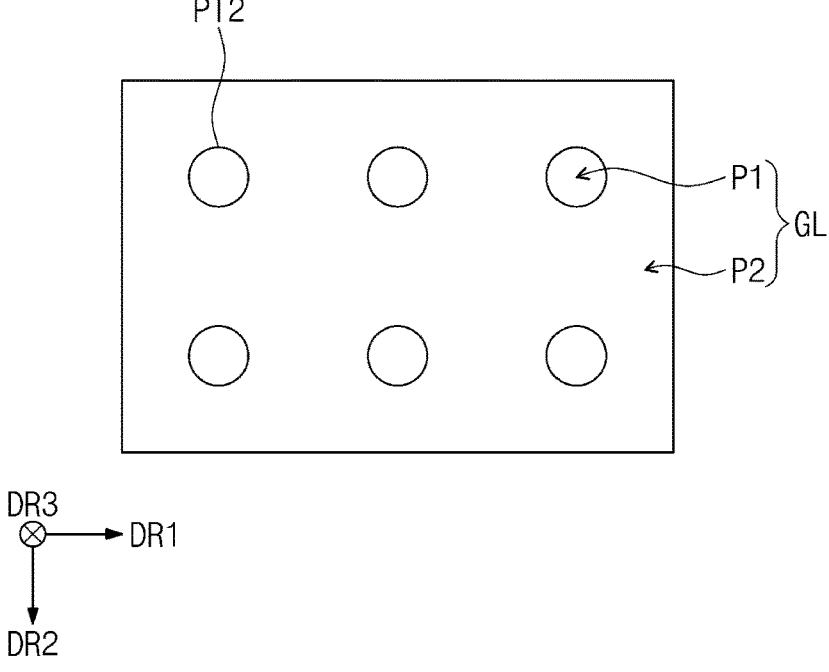
FIG. 5B is a rear view showing a glass substrate according to an embodiment of the present disclosure.
Figure 6:
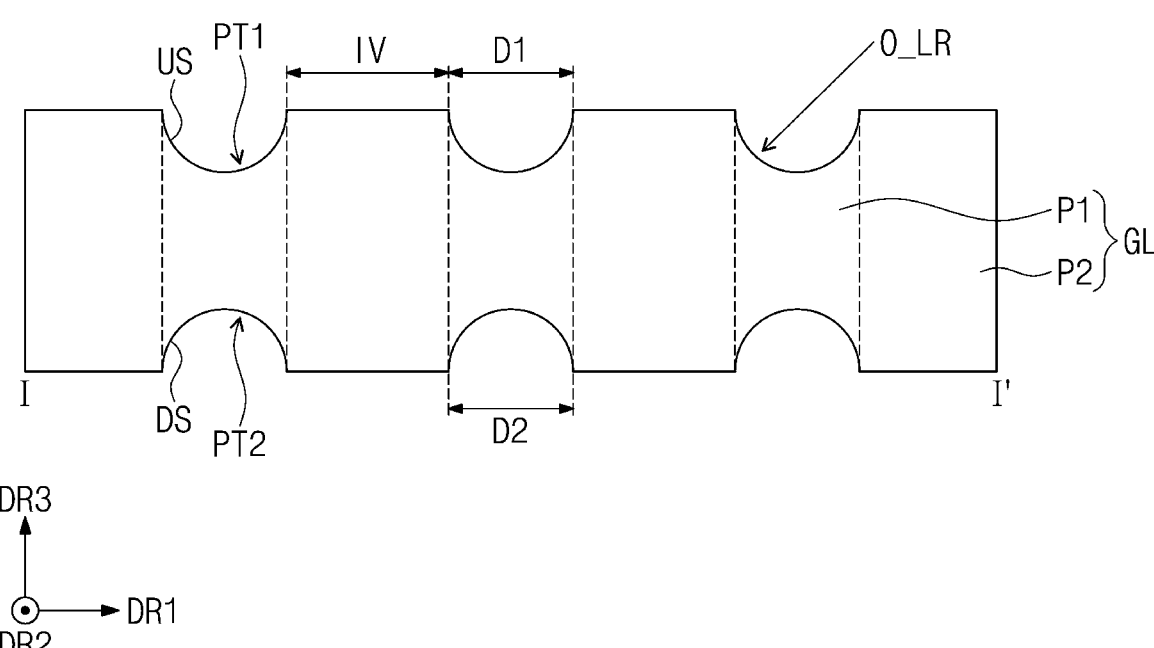
FIG. 6 is a cross-sectional view taken along line I-I' of FIG. 5A showing a glass substrate according to an embodiment of the present disclosure.

FIG. 5A is a plan view illustrating a glass substrate according to an embodiment of the present disclosure. FIG. 5B is a rear view showing a glass substrate according to an embodiment of the present disclosure. FIG. 6 is a cross-sectional view showing a glass substrate according to an embodiment of the present disclosure. FIG. 6 is a cross-sectional view of the glass substrate taken along a line I-I of FIG. 5A.

Referring to FIG. 5A, FIG. 5B and FIG. 6, the glass substrate GL according to an embodiment of the present disclosure includes a first portion P1 and a second portion P2. The glass substrate GL may include a plurality of first portions P1 and a plurality of second portions P2. The plurality of first portions P1 and the plurality of the second portions P2 are alternately arranged with each other along the first direction DR1. The plurality of first portions P1 and the plurality of second portions P2 may be alternately arranged with each other along the second direction DR2. The plurality of first portions P1 may include the same material, while the plurality of second portions P2 may include the same material.

A crystal content of the first portion P1 is different from that of the second portion P2. The crystal content of the first portion P1 may be lower than that of the second portion P2. In this regard, the crystal content may be defined as a ratio of a volume of a crystal portion based on a total volume. The crystal content of the first portion P1 may be in a range of about 0% to about 20%. For example, the first portion P1 may be made of amorphous glass. The crystal content of the second portion P2 may be in a range of about 80% to about 100%. For example, the second portion P2 may be made of a crystalline solid material. The second portion P2 of an embodiment may be made of a polycrystalline material. The second portion P2 may be crystallized glass (e.g., glass-ceramics) in which an aggregate of fine crystals is included in the glass. As the crystal content of the second portion P2 is higher than that of the first portion P1, the second portion P2 may have higher strength than that of the first portion P1, and the second portion P2 may have higher resistance to acidic solution than that of the first portion P1.

The crystal content of the glass substrate GL may be in a range of about 20% to about 80%. For example, the crystal content of the glass substrate GL may be in a range of about 40% to about 80%. In an embodiment in which the first portion P1 is composed of amorphous glass and the second portion P2 is composed of crystalline glass, the crystal content of the glass substrate GL may mean a ratio of a volume of the second portion P2 relative to a total volume of the glass substrate GL. For example, in an embodiment, the ratio of the volume of the second portion P2 relative to a sum of a volume of the first portion P1 and a volume of the second portion P2 may be in a range of about 20% to about 80%.

In an embodiment, each of the first portion P1 and the second portion P2 may independently include Li, Al, and $SiO_2$. A ratio of a Li phase to a total composition of the first portion P1, a ratio of an Al phase to the total composition of the first portion P1, and a ratio of a $SiO_2$ phase to the total composition of the first portion P1 may be equal to a ratio of a Li phase to a total composition of the second portion P2, a ratio of an Al phase to the total composition of the second portion P2, and a ratio of a $SiO_2$ phase to the total composition of the second portion P2, respectively. A Li atomic ratio, an Al atomic ratio, and a Si atomic ratio relative to the total composition of the first portion P1 may be equal to a Li atomic ratio, an Al atomic ratio, and a Si atomic ratio relative to the total composition of the second portion P2, respectively.

However, embodiments of the present disclosure are not necessarily limited thereto. For example, in an embodiment, a ratio of a Li phase to a total composition of the first portion P1, a ratio of an Al phase to the total composition of the first portion P1, and a ratio of a $SiO_2$ phase to the total composition of the first portion P1 may be different from a ratio of a Li phase to a total composition of the second portion P2, a ratio of an Al phase to the total composition of the second portion P2, and a ratio of a $SiO_2$ phase to the total composition of the second portion P2, respectively. A Li atomic ratio, an Al atomic ratio, and a Si atomic ratio relative to the total composition of the first portion P1 may be different from a Li atomic ratio, an Al atomic ratio, and a Si atomic ratio relative to the total composition of the second portion P2, respectively. For example, in an embodiment each of the first portion P1 and the second portion P2 may independently include one of $LiAl(SiO)_2$, $LiAlSi_4O_{10}$, and $Li_2Si_2O_5$. In this embodiment, the resistance of the first portion P1 to the acidic solution and the resistance of the second portion P2 to the acidic solution may be different from each other.

In an embodiment, the second portion P2 may include at least one of $P_2O_5$, $TiO_2$, and $ZrO_2$. The second portion P2 may further include a nucleating agent capable of promoting nucleation in amorphous glass in addition to $P_2O_5$, $TiO_2$, and $ZrO_2$. As the second portion P2 includes $LiAl(SiO)_2$, $LiAlSi_4O_{10}$, or $Li_2Si_2O_5$, and additionally includes $P_2O_5$, $TiO_2$, or $ZrO_2$, a type acting as a nucleus and the crystal content may be adjusted. Accordingly, the crystal content of the second portion P2 may be higher than the crystal content of the first portion P1, and a ratio of the $SiO_2$ phase to the total composition of the second portion P2 may be different from a ratio of the $SiO_2$ phase to the total composition of the first portion P1.

Referring to FIG. 5A and FIG. 6, a first depressed pattern PT1 is defined in an upper surface US of each of the plurality of first portions P1. The first depressed pattern PT1 may substantially define the first portion P1. For example, each of the plurality of first portions P1 may be defined as a portion of the glass substrate GL in which each of the plurality of first depressed patterns PT1 is defined. The first depressed pattern PT1 may be depressed in a direction opposite to the third direction DR3 from an upper surface of the second portion P2 towards the display module DM. A depth by which the first depressed pattern PT1 is depressed from the upper surface of the second portion P2 may increase as the first depressed pattern PT1 extends away from the second portion P2. The first depressed pattern PT1 may be depressed from the upper surface of the second portion P2 so as to extend toward the display module DM (see FIG. 2).

Referring to FIG. 5B and FIG. 6, a second depressed pattern PT2 may be defined in a lower surface DS of the first portion P1. The second depressed pattern PT2 may be depressed from a lower surface of the second portion P2 in the third direction DR3 towards an upper surface of the window WM. The second depressed pattern PT2 may be depressed from the lower surface of the second portion P2 so as to extend away from the display module DM (see FIG. 2). However, in some embodiments, unlike what is shown in FIG. 6, the second depressed pattern PT2 may not be defined in the lower surface DS of the first portion P1.

FIGS. 5A-6 shows by way of example that a shape of each of the first depressed pattern PT1 and the second depressed pattern PT2 in a plan view is circular. However, embodiments of the present disclosure are not necessarily limited thereto and the shape of each of the first depressed pattern PT1 and the second depressed pattern PT2 in the plan view may vary. For example, in an embodiment the shape of the first and second depressed patterns PT1, PT2 may be a polygon, depending on requirements, such as a pattern formation process or a condition for nucleation in amorphous glass.

Each of the first depressed pattern PT1 and the second depressed pattern PT2 may be defined in the first portion P1 having a relatively lower crystal content than that of the second portion P2. Each of the first depressed pattern PT1 and the second depressed pattern PT2 may be defined in the first portion P1 having relatively lower resistance to the acidic solution than that of the second portion P2. In the window manufacturing method according to an embodiment of the present disclosure, the acidic solution may be provided. In this regard, the first portion P1 has relatively low resistance to the acidic solution, such that the first depressed pattern PT1 may be formed in the upper surface US of the first portion P1, and the second depressed pattern PT2 may be formed in the lower surface DS of the first portion P1.

In an embodiment, at least a portion of the external light O_LR incident from the outside of the glass substrate GL may be Mie-scattered due to the first depressed pattern PT1 and the second depressed pattern PT2. Accordingly, the first depressed pattern PT1 and the second depressed pattern PT2 may reduce reflectivity of the external light O_LR from the glass substrate GL. In an embodiment, the window WM (see FIG. 4) does not include a separate color filter, a separate phase retarder, or a separate polarizer, and may have the lowered reflectivity of the external light O_LR due to the first depressed pattern PT1 and the second depressed pattern PT2.

In an embodiment, a first length D1 in the first direction DR1 of the first depressed pattern PT1 may be in a range of about 20 nm to about 2000 nm. In an embodiment, a ratio of a spacing IV (FIG. 6) in the first direction DR1 between adjacent ones of the plurality of first portions P1 to the first length D1 in the first direction DR1 may be in a range of about 0.7 to about 1.3. For example, the first length D1 of the first depressed pattern PT1 may be in a range of about 50 nm to about 400 nm. For example, the spacing IV in the first direction DR1 between adjacent ones of the plurality of first portions P1 may be in a range of about 35 nm to about 520 nm. Unlike an embodiment of the present disclosure, in an embodiment in which the first length D1 is designed to be less than about 20 nm, an amount by which the external light O_LR incident from the outside is Mie-scattered is less than an amount by which the external light O_LR incident from the outside is Rayleigh-scattered, such that transmittance of the glass substrate GL of light emitted from the display device DD (see FIG. 1) of an embodiment may be lowered. To the contrary, in an embodiment in which the first length D1 is designed to be greater than about 2000 nm, the transmittance of the glass substrate GL of the light emitted from the display device DD (see FIG. 1) of an embodiment may be lowered, and a haze value may be increased such that quality of the display device DD (FIG. 1) of an embodiment may deteriorate.

In an embodiment, a second length D2 in the first direction DR1 of the second depressed pattern PT2 may be in a range of about 20 nm to about 2000 nm. For example, the second length D2 of the second depressed pattern PT2 may be in a range of about 50 nm to about 400 nm. However, embodiments of the present disclosure are not necessarily limited thereto and the second length D2 may have various numerical values so as to adjust an amount by which the external light O_LR incident from the outside is Mie-scattered.

Hereinafter, a window manufacturing method of an embodiment of the present disclosure for manufacturing the above-described window will be described with reference to FIG. 7A to FIG. 7C, FIG. 8A and FIG. 8B. In the description of the window manufacturing method of an embodiment, contents duplicate with the contents of the window of an embodiment as described above may not be described again and the following description will focus on differences.

Figure 7A:
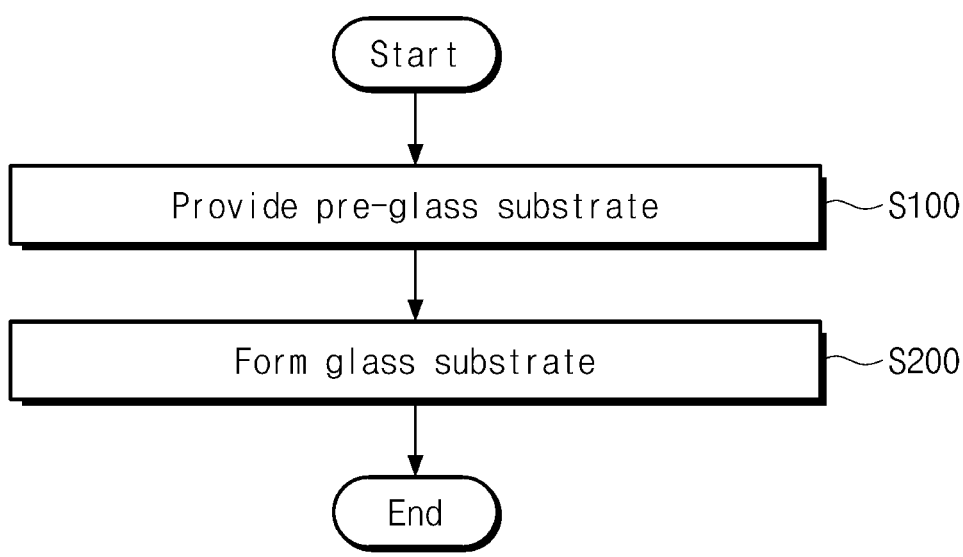
FIG. 7A to FIG. 7C are flowcharts showing a method for manufacturing a window according to embodiments of the present disclosure.
Figure 7B:
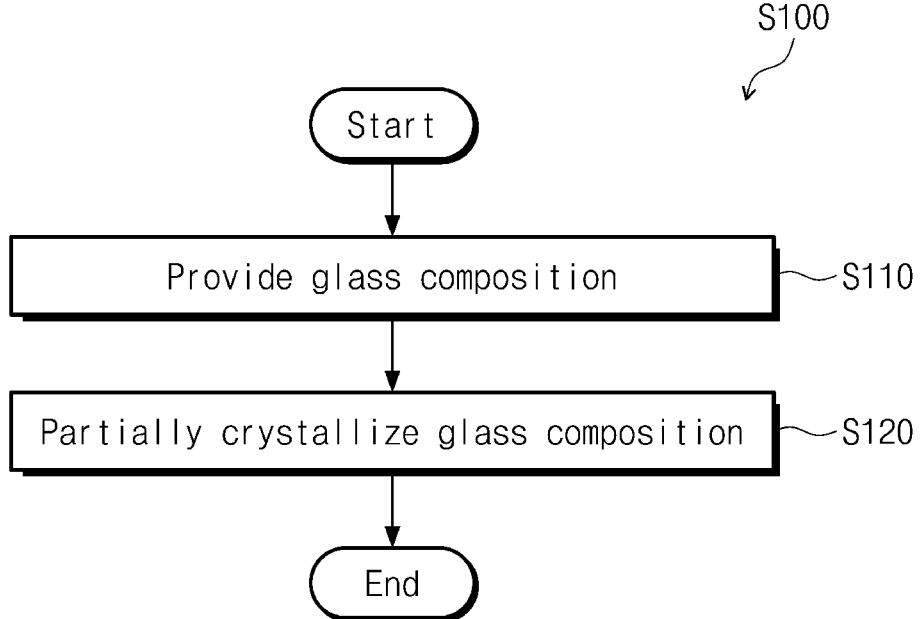
Figure 7C:
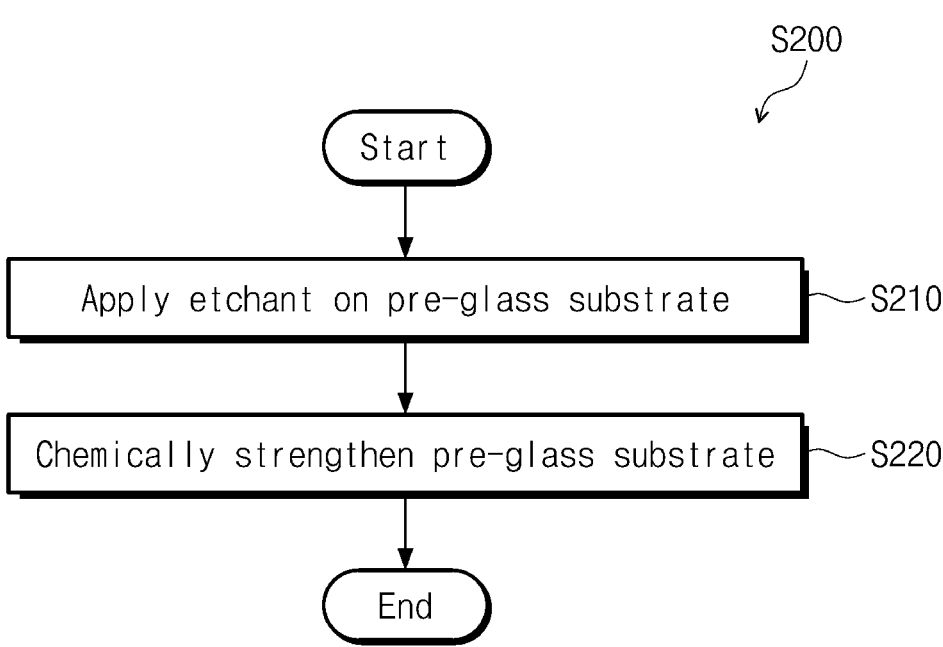

FIG. 7A is a flowchart showing a method for manufacturing the window according to an embodiment. FIG. 7B is a flowchart showing providing a pre-glass substrate in the method for manufacturing the window according to an embodiment. FIG. 7C is a flowchart showing forming a glass substrate in the window manufacturing method according to an embodiment.

Referring to FIG. 7A, the window manufacturing method according to an embodiment of the present disclosure includes providing a pre-glass substrate in block S100 and forming a glass substrate in block S200. Referring to FIG. 7B, in the window manufacturing method according to an embodiment, providing the pre-glass substrate in block S100 may include providing a glass composition in block S110 and partially crystallizing the glass composition in block S120. Referring to FIG. 7C, in the window manufacturing method according to an embodiment, forming the glass substrate in block S200 may include providing etchant on the pre-glass substrate in block S210 and chemically strengthening the pre-glass substrate in block S220.

Figure 8A:
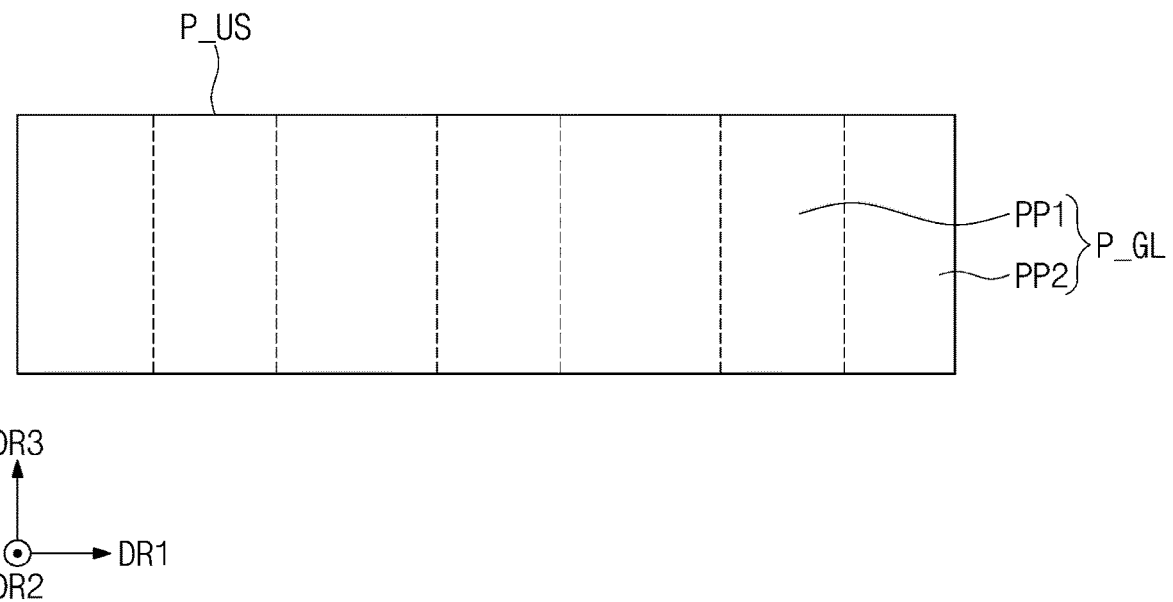
FIG. 8A and FIG. 8B are cross-sectional views showing some steps of a method for manufacturing a window according to embodiments of the present disclosure.
Figure 8B:
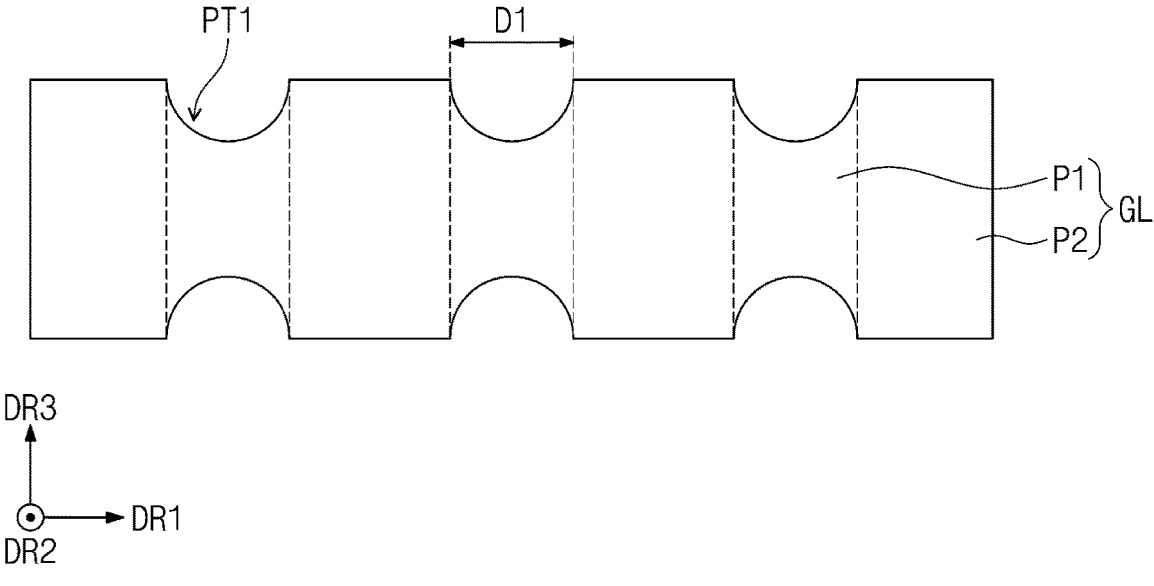

FIG. 8A and FIG. 8B are cross-sectional views of some steps of a method for manufacturing a window according to embodiments of the present disclosure.

Referring to FIG. 7A and FIG. 8A, the window manufacturing method according to some embodiments of the present disclosure includes providing the pre-glass substrate in block S100. A pre-glass substrate P_GL may include a plurality of first pre-portions PP1 and a plurality of second pre-portions PP2 alternately arranged with each other along the first direction DR1. The pre-glass substrate P_GL may be divided into the plurality of first pre-portions PP1 and the plurality of second pre-portions PP2.

Referring to FIG. 7B and FIG. 8A, providing the pre-glass substrate P_GL in block S100 may include providing the glass composition in block S110. In an embodiment, the glass composition may include a base material and a nucleating agent. The base material may include glass powders. In an embodiment, the base material may include $SiO_2$, $Al_2O_3$, and $Li_2O$. The base material may include one of $LiAl(SiO)_2$, $LiAlSi_4O_{10}$, and $Li_2Si_2O_5$. The nucleating agent may refer to a material which may be mixed with the base material and may be capable of growing a crystal. In an embodiment, the nucleating agent may include at least one of $TiO_2$, $P_2O_5$, and $ZrO_2$. A weight percentage of the nucleating agent relative to a total weight of the glass composition may be in a range of about 1 wt % to about 10 wt %. For example, the weight percentage of the nucleating agent relative to the total weight of the glass composition may be in a range of about 1 wt % to about 3 wt %. As the weight percentage of the nucleating agent has the above numerical range, the crystal content of the second portion P2 according to an embodiment of the present disclosure may have a value in a range of about 60% to about 90%.

In an embodiment, the providing of the pre-glass substrate P_GL in block S100 may include partially crystallizing the glass composition in block S120 after providing the glass composition. Partially crystallizing the glass composition may allow the crystal content of the first pre-portion PP1 to be lower than that of the second pre-portion PP2. Partially crystallizing the glass composition may include a nucleation step and a crystal growth step after the nucleation step. In an embodiment, the nucleation step may include heating the glass composition to a temperature in a range of about 500° C. to about 700° C. as a nucleation temperature. In an embodiment, the crystal growth step may include heating the glass composition in a range of about 600° C. to about 900° C. as a crystallization temperature. At least a portion of the pre-glass substrate P_GL may include crystallized glass (e.g., glass-ceramics) under the crystal growth step.

Referring to FIG. 7A, FIG. 8A, and FIG. 8B, the window manufacturing method according to an embodiment of the present disclosure includes forming the glass substrate GL in block S200. The forming of the glass substrate GL includes forming each of the plurality of first depressed patterns PT1 in the upper surface P_US of each of the plurality of first pre-portions PP1.

Referring to FIG. 7C, FIG. 8A, and FIG. 8B, in an embodiment the forming the glass substrate GL may include performing a wet etching process on one surface of the pre-glass substrate P_GL. The wet etching process for forming the glass substrate GL may include providing the etchant onto an upper surface of the pre-glass substrate P_GL in block S210. For example, the etchant may be the acidic solution. In an embodiment, the etchant may include at least one of nitric acid, ammonium fluoride, phosphoric acid, or hydrochloric acid, and the etchant may not include hydrofluoric acid. However, embodiments of the present disclosure are not necessarily limited thereto.

In the providing of the pre-glass substrate P_GL, a first pre-portion PP1 has a lower crystal content than that of the second pre-portion PP2. Thus, in the wet etching process on the pre-glass substrate P_GL, an etch rate at which the first pre-portion PP1 is etched by the etchant may be higher than an etch rate at which the second pre-portion PP2 is etched by the etchant. For example, the wet etching process on the pre-glass substrate P_GL may allow an amount by which the first pre-portion PP1 has been etched by the etchant to be greater than an amount by which the second pre-portion PP2 has been etched by the etchant. Accordingly, the upper surface P_US of the first pre-portion PP1 may be relatively depressed compared to the upper surface of the second pre-portion PP2. In this way, the first depressed pattern PT1 may be formed in the upper surface P_US of the first pre-portion PP1 via the wet etching process.

Forming the glass substrate GL may further include chemically strengthening the pre-glass substrate P_GL in block S220. In an embodiment, the forming of the glass substrate GL may include chemically strengthening the pre-glass substrate P_GL after the wet etching process. Alternatively, forming the glass substrate GL may include chemically strengthening the pre-glass substrate P_GL after providing the pre-glass substrate P_GL and before performing the wet etching process on the pre-glass substrate P_GL.

In an embodiment, chemically strengthening the pre-glass substrate P_GL may include providing a strengthening molten salt onto the pre-glass substrate P_GL to increase a surface strength of the pre-glass substrate P_GL using ion exchange. Chemically strengthening the pre-glass substrate P_GL may include strengthening the surface thereof in an ion exchange scheme. For example, in chemically strengthening the pre-glass substrate P_GL in the ion exchange scheme, alkali metal ions having a relatively small ionic radius on the surface of the pre-glass substrate P_GL may be exchanged with alkali metal ions having a larger ionic radius. In an embodiment, the chemical strengthening of the pre-glass substrate P_GL may employ a single salt containing one compound selected from a group consisting of $Li^+$, $Na^+$, $K^+$, $Rb^+$ and $Cs^+$ as the strengthening molten salt. Alternatively, chemical strengthening of the pre-glass substrate P_GL may employ a mixed salt containing two types selected from the group consisting of $Li^+$, $Na^+$, $K^+$, $Rb^+$ and $Cs^+$ as the strengthening molten salt. However, embodiments of the present disclosure are not necessarily limited thereto.

Hereinafter, a characteristic evaluation result of a window according to an embodiment of the present disclosure will be described with reference to Present Examples and Comparative Example. Further, Present Example as indicted below is an example to help understanding of the present disclosure, and embodiments of the present disclosure is not necessarily limited thereto.

Each of following Present Example 1 to Present Example 4 and Comparative Example corresponds to a window designed to include the glass substrate GL as shown in FIG. 6. Table 1 below shows the first length D1 of the first depressed pattern PT1 in the glass substrate GL included in each of Present Example 1 to Present Example 4 and Comparative Example. Present Example 1 to Present Example 4 and Comparative Example were manufactured so that the first lengths D1 of the glass substrate GL thereof had different values.

TABLE 1

| Example | First length D1 (nm) |
|---|---|
| Present Example 1 | 100 |
| Present Example 2 | 300 |
| Present Example 3 | 500 |
| Present Example 4 | 1000 |
| Comparative Example | 0 |

Figure 9:
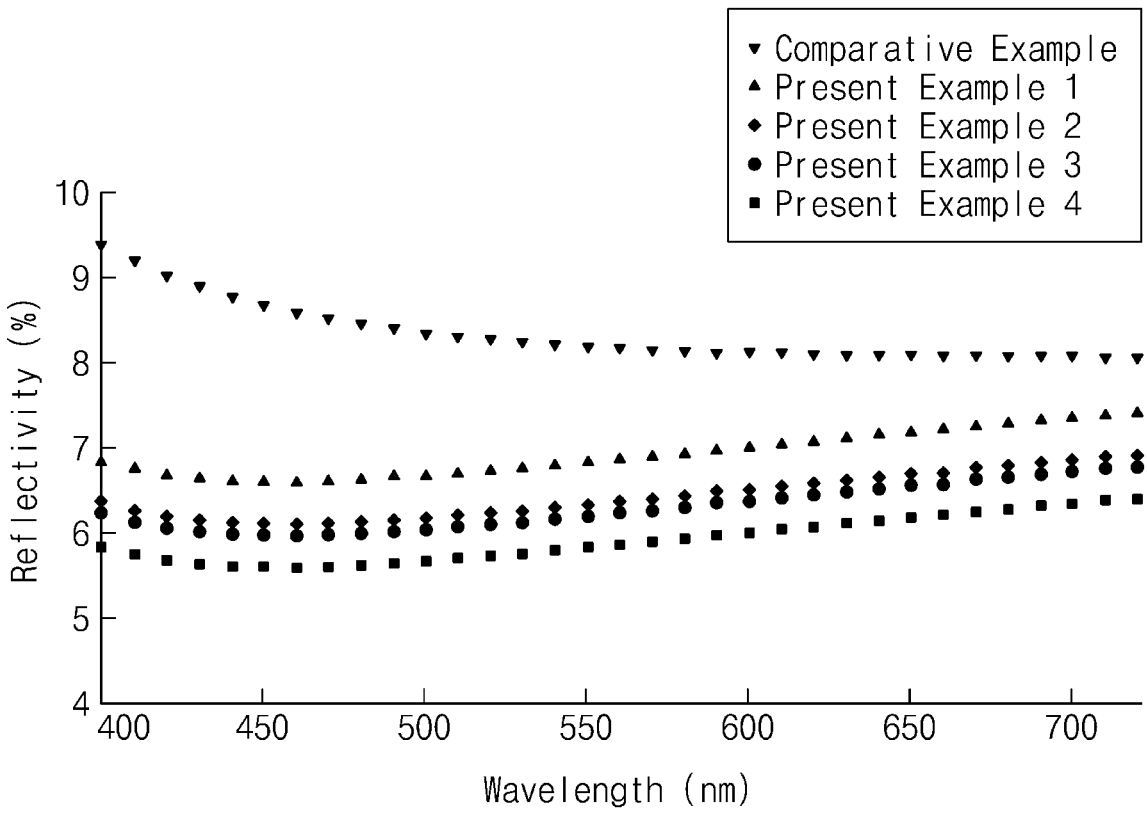
FIG. 9 is a graph showing reflectivity of external light of each of Present Example and Comparative Example.

Referring to Table 1, the glass substrate GL included in each of Present Example 1 to Present Example 4 has the first length D1 of 20 nm to 2000 nm. In comparison therewith, the first length D1 of the glass substrate GL included in Comparative Example has a value of 0 nm, and thus the glass substrate GL included in Comparative Example does not substantially include the first depressed pattern PT1. FIG. 9 is a graph showing reflectivity of external light of the glass substrate of each of Present Example 1 to Present Example 4 and Comparative Example. For example, in FIG. 9, a ratio of an amount by which light is reflected from an upper surface of each of Present Example 1 to Present Example 4 and Comparative Example with respect to a total amount of external light reaching the upper surface of each of Present Example 1 to Present Example 4 and Comparative Example is expressed as a percentage value (e.g., a Reflectivity Percentage). FIG. 9 shows the reflectivity of each of Present Example 1 to Present Example 4 and Comparative Example based on a light wavelength length (nm). Referring to FIG. 9, it may be identified that the reflectivity of each of Present Example 1 to Present Example 4 of light in the wavelength range of 400 nm to 700 nm is lower than that of Comparative Example of light in the wavelength range of 400 nm to 700 nm. In particular, it may be identified that the reflectivity of each of Present Example 1 to Present Example 4 of light of a short wavelength range of 550 nm or less is lower than that of Comparative Example of light of a short wavelength range of 550 nm or less. Present Example 1 to Present Example 4 of the present disclosure is free of a separate reflective functional layer such as a polarizing film, but includes the first depressed pattern PT1 (see FIG. 6) having the first length D1 (see FIG. 6) in a range of 20 nm to 2000 nm, thereby lowering reflectivity of the external light. Thus, the window that increases the display quality of the display device may be realized.

The evaluation result of the characteristics of a display device including each of Present Example 1 to Present Example 4 and Comparative Example is shown in Tables 2 and 3 below. Table 2 shows reflectivity percentage of a total amount of external light with a wavelength of 550 nm, transmittance percentage of light with a wavelength of 550 nm emitted from the display device, and CIE color coordinates of light emitted from the display device. In the evaluation of the characteristics of Table 3, hardness 1 showed a hardness value measured using a nano indenter in an environment with an indentation depth of 0.5 µm, and hardness 2 showed a hardness value measured using a nano indenter in an environment with a load of 2N.

TABLE 2

| Example | Reflectivity Percentage @550 nm | Transmittance Percentage @550 nm | Color coordinates (a*/b*) |
|---|---|---|---|
| Present Example 1 | 6.8 | 92 | 0.3/−0.8 |
| Present Example 2 | 6.3 | 92.5 | 0.6/0.9 |
| Present Example 3 | 5.8 | 93 | 0.6/1.0 |
| Present Example 4 | 6.2 | 93 | 0.6/1.0 |
| Comparative Example | 8.2 | 91 | 0.3/−1.5 |

TABLE 3

| Example | hardness 1(GPa) | hardness 2(GPa) |
|---|---|---|
| Present Example 1 to Present Example 4 | 11.6 to 12.2 | 8.7 to 9.1 |
| Comparative Example | 8.7 to 9.1 | 7.6 to 7.8 |

Referring to Table 2, it may be identified that the reflectivity of each of Present Example 1 to Present Example 4 of light in the 550 nm wavelength range is lower than that of Comparative Example of light in the 550 nm wavelength range. Accordingly, a display device including a window according to an embodiment of the present disclosure may have lowered reflectivity of external light to increase display quality. Further, as Present Example has low reflectivity of light in the 550 nm wavelength range, the color coordinate b* value of the Present Example has a higher value than the color coordinate b* value of the Comparative Example, thereby preventing being bluish. Further, the transmittance of each of Present Example 1 to Present Example 4 has a value of 92% or higher, and thus each of Present Example 1 to Present Example 4 may function as a cover window for the display module DM (see FIG. 2) in the display device of the present disclosure. Referring to Table 3, it may be identified that the hardness of each of Present Example 1 to Present Example 4 is higher than that of Comparative Example. Each of Present Example 1 to Present Example 4 includes one of $ZrO_2$, $TiO_2$, and $P_2O_5$, and thus includes crystallized glass (e.g., glass-ceramics) and thus may have a higher hardness value than that of Comparative Example. Accordingly, the display device including the Present Example of the present disclosure includes a glass substrate having high hardness characteristics, such that sufficient impact resistance may be secured, and thus, reliability and stability of the display device may be increased.

The window of an embodiment may have lowered reflectivity of external light.

The display device of an embodiment includes the window having lowered reflectivity of external light and thus has increased display quality.

The window manufacturing method of an embodiment manufactures the glass substrate of an embodiment including the first depressed pattern using the wet etching process, thereby providing the window having high hardness and reduced reflectivity.

While the present disclosure has been described with reference to non-limiting embodiments thereof, it will be apparent to those of ordinary skill in the art that various changes and modifications may be made thereto without departing from the spirit and scope of the present disclosure.

What is claimed is:

1. A window, comprising:
   a glass substrate that includes a plurality of first portions and a plurality of second portions, the plurality of first and second portions are alternately arranged with each other along a first direction,
   wherein an upper surface of each of the plurality of first portions includes a first depressed pattern of a plurality of first depressed patterns defined therein,
   wherein a first length in the first direction of each of the plurality of first depressed patterns is in a range of about 20 nm to about 2000 nm,
   wherein a crystal content of each of the plurality of second portions is greater than a crystal content of each of the plurality of first portions.

2. The window of claim 1, wherein a crystal content of the glass substrate is in a range of about 20% to about 80%.

3. The window of claim 1, wherein a ratio of a spacing in the first direction between adjacent ones of the plurality of first portions to the first length is in a range of about 0.7 to about 1.3.

4. The window of claim 1, wherein a lower surface of each of the plurality of first portions that is opposite to the upper surface of each of the plurality of first portions includes a second depressed pattern of a plurality of second depressed patterns defined therein,
   wherein a second length in the first direction of each of the plurality of second depressed patterns is in a range of about 20 nm to about 2000 nm.

5. The window of claim 1, wherein an outer surface of the glass substrate is an outermost surface of the window.

6. The window of claim 1, wherein the glass substrate includes one compound selected from $LiAl(SiO)_2$, $LiAlSi_4O_{10}$, and $Li_2Si_2O_5$.

7. The window of claim 6, wherein a Si atomic ratio relative to a total composition of each of the plurality of first portions is different from a Si atomic ratio relative to a total composition of each of the plurality of second portions.

8. The window of claim 1, wherein each of the plurality of second portions includes one compound selected from $P_2O_5$, $TiO_2$, and $ZrO_2$.

9. A display device comprising:
   a display module; and
   a window disposed on the display module, the window including a glass substrate,
   wherein the glass substrate includes a plurality of first portions and a plurality of second portions, the plurality of first and second portions are alternately arranged with each other along a first direction,
   wherein an upper surface of each of the plurality of first portions includes a first depressed pattern of a plurality of first depressed patterns defined therein,
   wherein a first length in the first direction of each of the plurality of first depressed patterns is in a range of about 20 nm to about 2000 nm,
   wherein a crystal content of each of the plurality of second portions is greater than a crystal content of each of the plurality of first portions.

10. The display device of claim 9, wherein at least a portion of natural light incident on a first portion of the plurality of first portions or a second portion of the plurality of second portions is Mie-scattered at the first portion or the second portion.

11. The display device of claim 9, wherein the glass substrate does not include $MgF_2$ or $MgO$.

12. A method for manufacturing a window, the method comprising:

providing a pre-glass substrate including a plurality of first pre-portions and a plurality of second pre-portions, the plurality of first and second pre-portions are alternately arranged with each other along a first direction, and forming a first depressed pattern of a plurality of first depressed patterns in an upper surface of each of the plurality of first pre-portions, thereby forming a glass substrate, wherein a crystal content of each of the plurality of first pre-portions is lower than a crystal content of each of the plurality of second pre-portions, wherein a first length in the first direction of each of the plurality of first depressed patterns is in a range of about 20 nm to about 2000 nm.

13. The method of claim 12, wherein the providing of the pre-glass substrate includes providing a glass composition, wherein the glass composition includes a base material and a nucleating agent, wherein the base material includes one compound selected from $LiAl(SiO)_2$, $LiAlSi_4O_{10}$, and $Li_2Si_2O_5$, wherein the nucleating agent includes one compound selected from $P_2O_5$, $TiO_2$, and $ZrO_2$.

14. The method of claim 13, wherein a weight percentage of the nucleating agent relative to a total weight of the glass composition is in a range of about 1 wt % to about 10 wt %.

15. The method of claim 13, wherein the providing of the pre-glass substrate further includes partially crystallizing the glass composition after the providing of the glass composition is performed.

16. The method of claim 15, wherein the partially crystallizing of the glass composition includes a nucleation step and a crystal growth step, wherein the nucleation step is performed at a temperature in a range of about 500° C. to about 700° C., wherein the crystal growth step is performed at a temperature in a range of about 600° C. to about 900° C.

17. The method of claim 12, wherein:

the forming of the glass substrate includes performing a wet etching process on a surface of the pre-glass substrate, wherein the wet etching process includes applying etchant on the pre-glass substrate.

18. The method of claim 17, wherein the etchant includes at least one compound selected from nitric acid, ammonium fluoride, phosphoric acid, and hydrochloric acid.

19. The method of claim 17, wherein an etch rate at which the plurality of first pre-portions is etched by the etchant is greater than an etch rate at which the plurality of second pre-portions is etched by the etchant.

20. The method of claim 17, wherein:

the forming of the glass substrate includes chemical strengthening of the pre-glass substrate, wherein the chemical strengthening of the pre-glass substrate is performed after the wet etching process is performed or is performed after the providing of the pre-glass substrate is performed and before the wet etching process is performed.

\* \* \* \* \*